United States Patent [19]

Shinozawa

[11] Patent Number: 5,187,108
[45] Date of Patent: Feb. 16, 1993

[54] METHOD OF MANUFACTURING A BIPOLAR TRANSISTOR

[75] Inventor: Masahiko Shinozawa, Tokyo, Japan

[73] Assignee: Oki Electric Industry Co., Ltd., Minato, Japan

[21] Appl. No.: 641,737

[22] Filed: Jan. 14, 1991

[30] Foreign Application Priority Data

Jan. 16, 1990 [JP] Japan ......................... 2-4450

[51] Int. Cl.⁵ .................... H01L 21/265; H01L 21/20
[52] U.S. Cl. ........................................ 437/31; 437/32; 437/90; 437/228
[58] Field of Search ................... 437/31, 32, 33, 90, 437/102; 156/643; 148/DIG. 11, DIG. 124, DIG. 125; 357/34

[56] References Cited

U.S. PATENT DOCUMENTS

| | | | |
|---|---|---|---|
| 4,140,558 | 2/1979 | Murphy et al. | 437/67 |
| 4,333,227 | 6/1982 | Horng | 437/33 |
| 4,693,782 | 9/1987 | Kikuchi et al. | 437/31 |
| 4,735,912 | 4/1988 | Kawakatsu . | |
| 4,783,422 | 11/1988 | Kawkatsu . | |
| 4,824,799 | 4/1989 | Komatsu | 437/162 |
| 4,851,362 | 7/1989 | Suzuki | 437/31 |
| 4,866,000 | 9/1989 | Okita . | |
| 4,873,200 | 10/1989 | Kawakatsu . | |
| 4,887,145 | 12/1989 | Washio et al. | 357/34 |
| 4,946,798 | 8/1990 | Kawakatsu . | |
| 4,975,381 | 12/1990 | Taka et al. | 148/DIG. 124 |

OTHER PUBLICATIONS

J. van der Velden et al., "Basic: An Advanced High-Performance Bipolar Process", IEDM 89, pp. 233–236.

*Primary Examiner*—Olik Chaudhuri
*Assistant Examiner*—Loc Q. Trinh
*Attorney, Agent, or Firm*—Spencer, Frank & Schneider

[57] ABSTRACT

A method of manufacturing a bipolar transistor includes selectively removing portions of a semiconductor layer on a semiconductor substrate photolithographically to form an isolation trench and first and second mesa regions surrounded and separated by the trench, and forming a first insulation film on inner walls of the trench. Then, a second insulation film is formed on the upper surfaces of the mesa regions, and a first polycrystalline silicon layer is formed on the first insulation film. Polycrystalline silicon is selectively grown from the first polycrystalline silicon layer onto the second insulation film to form a second polycrystalline silicon layer while leaving exposed a portion of the second insulation film. Then, a part of second insulation film is removed to expose the upper surface of the first mesa region so as to leave a gap between the exposed upper surface and the second polycrystalline silicon layer, while leaving the upper surface of the second mesa region covered by the remaining second insulation film. Polycrystalline silicon is deposited in the gap so as to connect the second polycrystalline silicon layer to the exposed upper surface. A third insulating film is formed covering upper and side surfaces of the second polycrystalline silicon layer. The exposed portion of the second insulating film on the second mesa region is then removed to expose a portion of the upper surface of the second mesa region. A base and an emitter are formed in the first mesa region.

21 Claims, 6 Drawing Sheets

5,187,108

METHOD OF MANUFACTURING A BIPOLAR TRANSISTOR

CROSS-REFERENCE TO RELATED APPLICATIONS

This application claims the priority of Japanese Application Serial No. 2-4,450, filed Jan. 16, 1990, the subject matter of which is incorporated herein by reference.

BACKGROUND OF THE INVENTION

This invention relates to a method of manufacturing a semiconductor IC device and more particularly, to a method of manufacturing a bipolar semiconductor device suitable for an emitter coupled logic/current mode logic (hereafter ECL/CML) circuit.

Where high speed operations are required, ECL/CML type bipolar semiconductor devices are widely used. Prior methods of manufacturing bipolar semiconductor devices are disclosed in many United State patents, including U.S. Pat. Nos. 4,735,912, 4,783,422, 4,866,000, 4,873,200 and 4,946,798.

For example, U.S. Pat. No. 4,783,422 discloses a process for fabricating a bipolar transistor having a reduced junction capacitance between a base and an emitter. In this process, however, it is impossible to minimize the size (width) of the active region photolithographically because the base and the emitter are formed in the active region photolithographically.

SUMMARY OF THE INVENTION

It is an object of the present invention to provide a method of manufacturing a bipolar transistor in which the base region and the emitter region can be formed by self-alignment. It is another object of the present invention to provide a method of manufacturing a bipolar transistor in which the area of the base region is defined photolithographically as small as possible. It is still another object of the present invention to provide a method of manufacturing a bipolar transistor having a narrow base-collector junction area. It is a further object of the present invention to provide a method of manufacturing a bipolar transistor having a low base-collector parasitic capacitance. It is another object of the present invention to provide a method of manufacturing a bipolar transistor in which the area of the emitter region is made smaller than can be made defined photolithographically. It is a still further object of the present invention to provide a method of manufacturing a bipolar transistor having a high operating speed.

A method of manufacturing a bipolar transistor according to the invention includes the steps of:
a. positioning a first region and a second region on a semiconductor substrate, at least the first region being positioned photolithographically;
b. forming a first polycrystalline silicon layer around the first region;
c. electrically insulating the first and second regions from the first polycrystalline silicon layer;
d. forming a second polycrystalline silicon layer extending from the first polycrystalline silicon layer onto an upper surface of the first region, with a portion of the upper surface of the first region remaining exposed, the step of forming a second polycrystalline silicon layer including the step of selectively growing polycrystalline silicon from the first polycrystalline silicon layer over the upper surface of the first region;
e. forming an emitter in the first region at the exposed portion of the upper surface of the first region, forming a base in the first region connecting the emitter to the second polycrystalline silicon layer, and forming a collector which extends in the substrate from the base to the upper surface of the second region; and
f. electrically connecting a base electrode, an emitter electrode and a collector electrode to the base, the emitter and the collector, respectively.

A method of manufacturing a bipolar transistor according to a preferred embodiment of the invention includes providing a semiconductor substrate having on a side thereof a first mesa region and a second mesa region, the mesa regions being formed of a semiconductor material of a given conductivity type. An isolation trench separates and surrounds the mesa regions. The mesa regions are formed photolithographically. Further semiconductor material of the given conductivity type in a layer below the trench to connect the first and second mesa regions. A first insulation film is formed on inner walls of the isolation trench. Then, a second insulation film is formed on the upper surfaces of the mesa regions, and a first polycrystalline silicon layer is formed on the first insulation film. After that, polycrystalline silicon is selectively grown from the first polycrystalline silicon layer onto the second insulation film to form a second polycrystalline silicon layer which leaves exposed a portion of the second insulation film. Then, a part of second insulation film is removed to expose the upper surface of the first mesa region so as to leave a gap between the exposed upper surface and the second polycrystalline silicon layer, while leaving the upper surface of the second mesa region covered by the remaining second insulation film. Polycrystalline silicon is deposited in the gap so as to connect the second polycrystalline silicon layer to the exposed upper surface. A third insulating film is formed covering upper and side surfaces of the second polycrystalline silicon layer. The exposed portion of the second insulating film on the second mesa region is then removed so as to expose a portion of the upper surface of the second mesa region. An emitter is formed in the first mesa region at the exposed portion of the upper surface of the first region. A base is formed in the first region to connect the emitter to the second polycrystalline silicon layer. A collector is formed from the semiconductor material connecting the first and second mesa regions.

According another aspect of the invention, the gap between the exposed upper surface and the second polycrystalline silicon layer is filled, the third insulating layer is provided and a portion of the upper surface of the second mesa region is exposed, by the following process: Polycrystalline silicon is deposited on the exposed upper surface of the first mesa region, on the second polycrystalline silicon layer, and on the exposed portion of the remaining second insulation film on the upper surface of the second mesa region, to form a third polycrystalline silicon layer. Then, an impurity is introduced into the part of the third polycrystalline silicon layer which is located over the second polycrystalline silicon layer. The entire third polycrystalline silicon layer is then oxidized to form the third insulating layer, which is subjected to anisotropic etching until the upper surfaces of both mesa regions are exposed.

Since the second polycrystalline silicon layer is grown to cover part, but not all, of the surface of second insulation film which covers the upper surface of a mesa region, the area which is still exposed defines a smaller area than the area of the upper surface of the mesa region. The area of the upper surface of the mesa region is formed photolithographically. The exposed area of the upper surface of the mesa region defines the size of an emitter region. Therefore, the emitter region can be made smaller than the area obtained photolithographically. Thus, the emitter region can be made smaller by the method of the invention than can be formed photolithographically.

BRIEF DESCRIPTION OF THE DRAWINGS

These and other features and advantages of the invention will be further understood from the following detailed description of the preferred embodiment with reference to the accompanying drawings in which.

DETAILED DESCRIPTION OF THE PREFERRED EMBODIMENT

Figure 1:
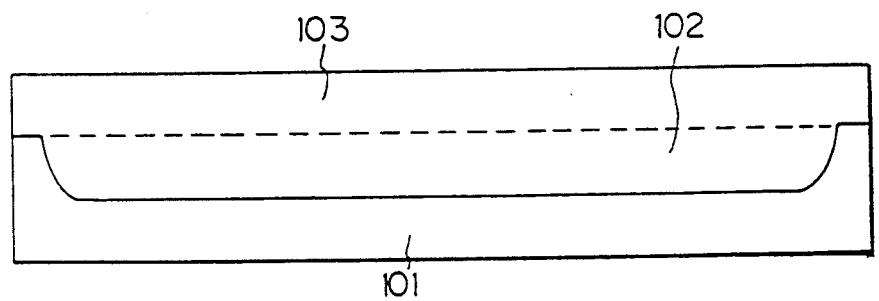
FIGS. 1-17 are sectional views showing various steps in a method of manufacturing a bipolar transistor utilizing an isolation trench according to the preferred embodiment of the invention.

A preferred embodiment of the invention will be described with reference to the drawings. FIGS. 1-17 illustrate the fabrication steps in the embodiment. An N+ semiconductor zone or buried layer 102 is formed on one surface of a P type semiconductor substrate 101. An epitaxial layer 103 is formed on the N+ buried layer 102 and the surface of the semiconductor substrate 101, as shown in FIG. 1.

Figure 2:
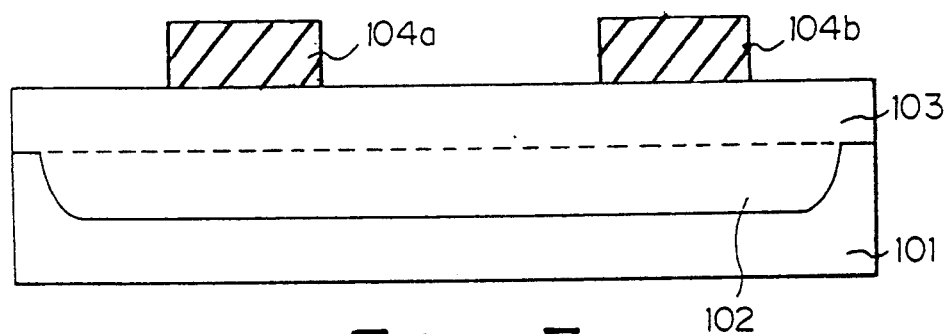

As shown in FIG. 2, a plurality of patterned resist layers 104a and 104b (of which one pair is shown) are formed on predetermined portions of the N− epitaxial layer 103 at which transistors will be formed photolithographically. To form a high speed transistor, the patterned resist layers should be formed as small as can be made photolithographically.

Figure 3:
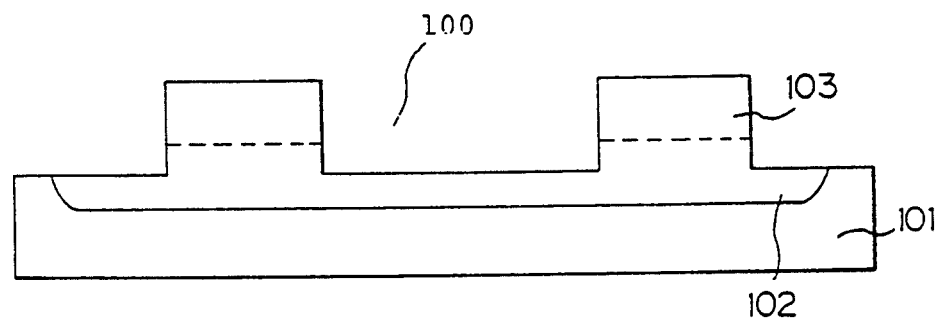

Referring to FIG. 3, the N− epitaxial layer 103, the N+ buried layer 102 and the semiconductor substrate 101 are subjected to anisotropic etching to form an isolation trench 100 and a plurality of mesa regions 103a and 103b of the N− epitaxial layer 103 (two such regions, necessary for a single transistor, are illustrated), using the patterned resist layers 104a and 104b as a mask. The thickness of the N+ buried layer 102 is reduced by the anisotropic etching, but the semiconductor substrate 101 located under the N+ buried layer 102 is not exposed. Then, the patterned resist layer 104a and 104b are removed.

Figure 4:
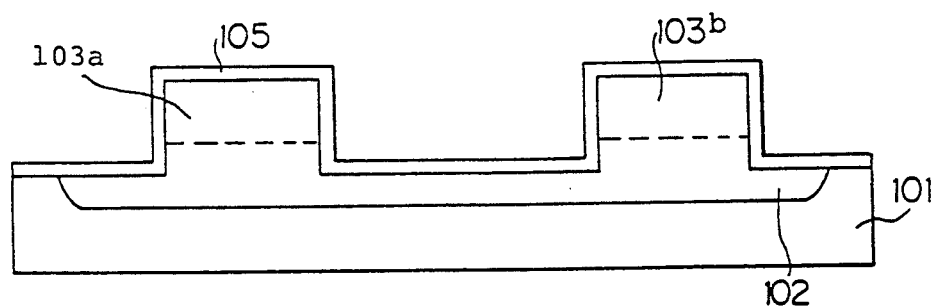

Next, an insulating layer 105 formed of silicon nitride and having a thickness of less than 500 Å is formed on the entire surface of the structure obtained above, as shown in FIG. 4. The silicon nitride layer 105 is subjected to anisotropic etching so that only the side walls 105a to 105d thereof remain, as shown in FIG. 5.

Figure 5:
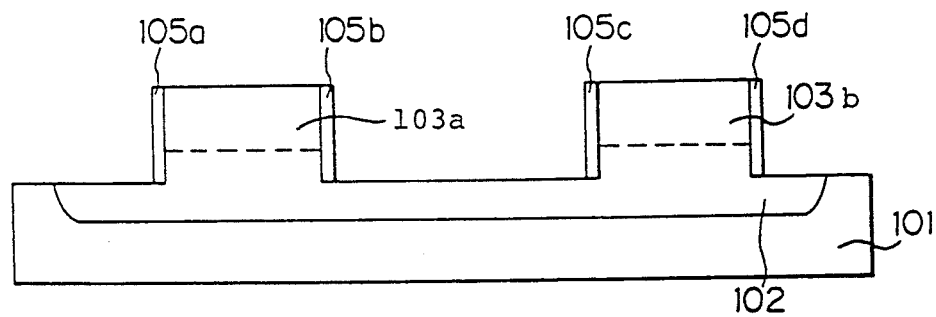
Figure 6:
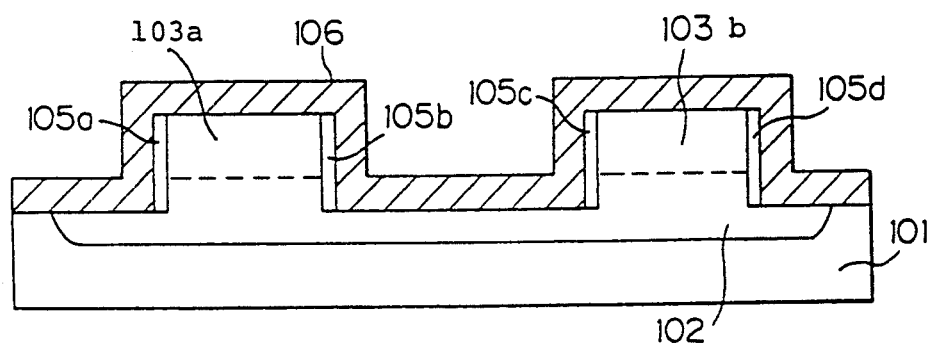
Figure 7:
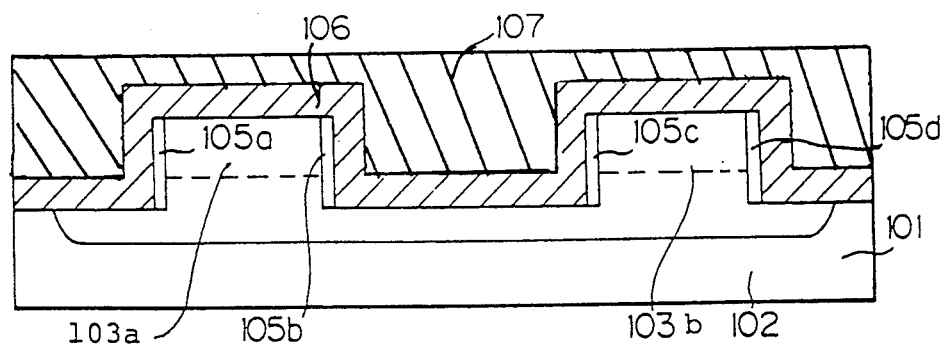

A chemical vapor deposition (CVD) film of silicon oxide is deposited on the entire surface of the structure shown in FIG. 5 to form a first insulation film 106 having a thickness of about 3000 Å, as shown in FIG. 6. A resist layer 107 is formed on the first insulation film 106 with a flat upper surface, as shown in FIG. 7.

Figure 8:
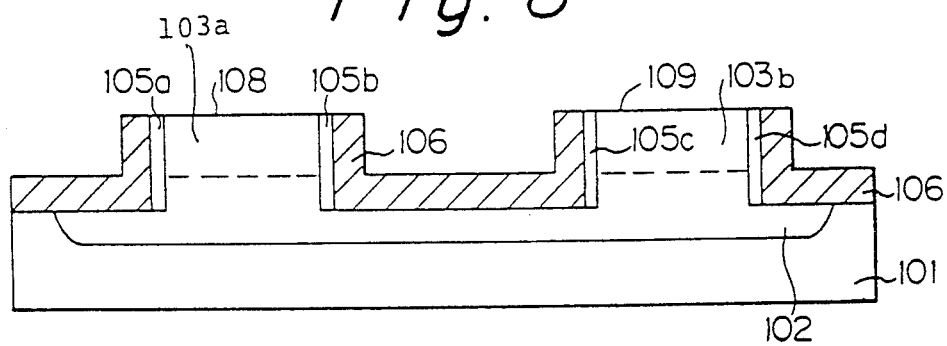

The resist layer 107 and the insulation film 106 are etched by the same speed etching method until the exposed upper surfaces 108 and 109 of the mesa regions 103a and 103b are exposed, and so that only the portions of first insulation film 106 on the inner walls of the isolation trench 100 including the peripheral surfaces of the mesa regions 103a and 103b, remain. Remaining portions of the resist layer 107 are also removed, as shown in FIG. 8.

Figure 9:
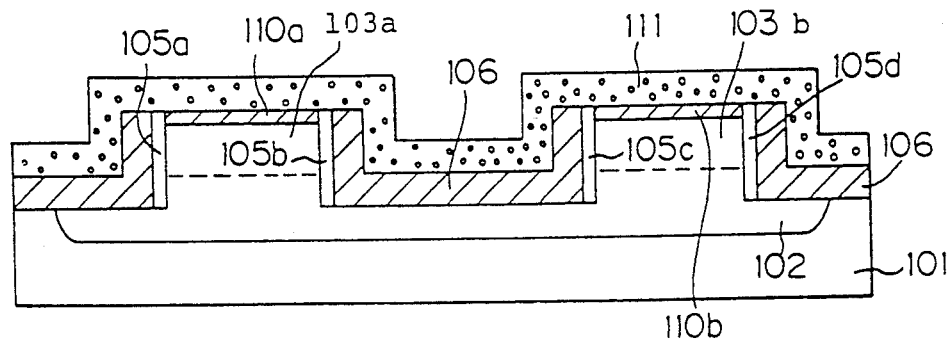

The surfaces 108 and 109 of the mesa regions 103a and 103b are oxidized to a thickness of about 200 to 500 Å to form respective silicon oxide films 110a and 110b as a second insulation film or mask film. Then, a CVD layer of polycrystalline silicon is deposited on the entire surface of the structure obtained above to form a first polycrystalline silicon layer 111, as shown in FIG. 9. After that, an impurity, for example boron ions, is introduced into the first polycrystalline silicon layer 111 by ion implantation at a dosage of about $10^{13}$–$10^{14}$ cm$^{-2}$. The energy of the ion implantation is about 40 KeV.

Figure 10:
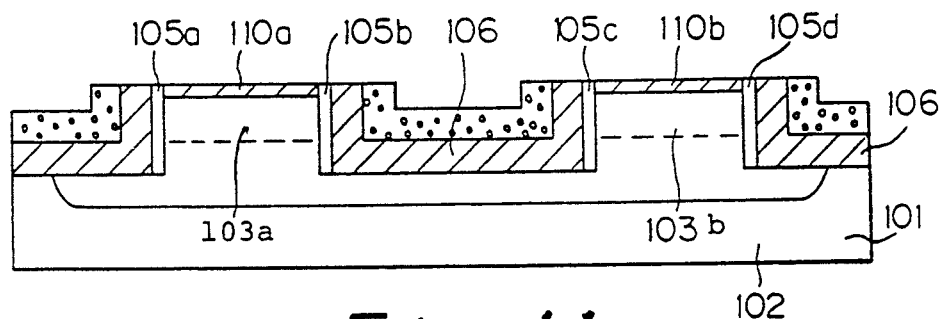

Next, a resist layer with a flat upper surface (not shown) is deposited on the first polycrystalline silicon layer 111. Then, the resist layer and the first polycrystalline silicon layer 111 are etched with the same speed to expose the silicon oxide films 110a and 110b, as shown in FIG. 10.

Figure 11:
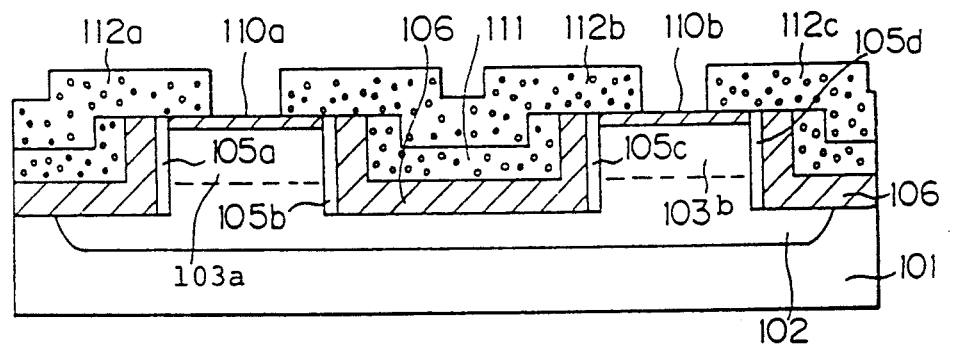

Polycrystalline silicon is then grown on and around the first polycrystalline silicon layer 111 by the selective polycrystalline silicon growth method to form second polycrystalline silicon layers 112a, 112b and 112c, each having a thickness of about 1000–2000 Å, as shown in FIG. 11. The rates of application of the forming gases used to perform the selective polycrystalline silicon growth method are, for example, H2: 80 liters per minute (l/M), HCl: 0.7 l/M, and SiH2Cl2: 0.33 l/M, and the pressure is about 25 torr.

The second polycrystalline silicon layers 112a, 112b and 112c do not cover all surfaces of the silicon oxide films 110a and 110b. That is, the layers cover outer regions of the films 110a and 110b while a portion (inner regions) of the silicon oxide films 110a and 110b remain exposed. Since the areas of the silicon oxide films 110a and 110b may be the minimum which can be obtained using photolithographic methods, the exposed portions remaining after the performance of selective polycrystalline silicon growth are smaller than the minimum areas which can be obtained photolithographically. Since the exposed portion of the silicon oxide film 110a defines the area of the emitter region to be formed as described below, the emitter region can be made smaller than the minimum area obtained photolithographically.

Figure 12:
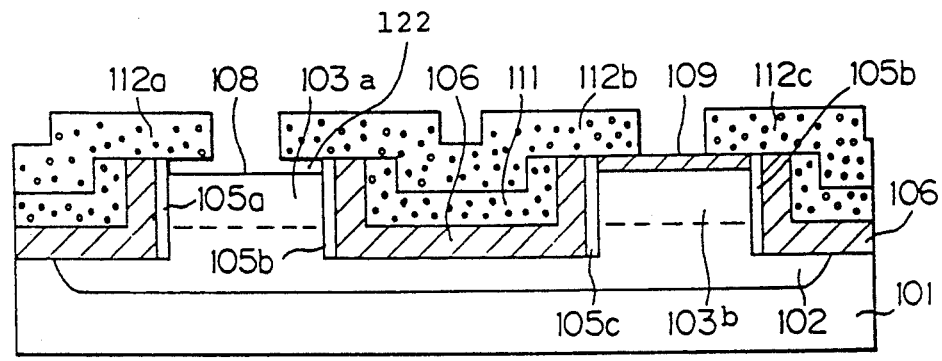

The second polycrystalline silicon layers 112a, 112b and 112c are then doped with boron ions by diffusion from the first polycrystalline silicon layer 111. The silicon oxide film 110b is then covered by a resist layer (not shown) and the silicon oxide film 110a is removed by a hydrogen fluoride buffer solution to expose the upper surface 108 of the mesa region 103a, leaving a gap 122 between the polycrystalline silicon layer 112a, 112b and the surface 108, as shown in FIG. 12. Then, the resist severing the silicon guide film 110b is removed.

Figure 13:
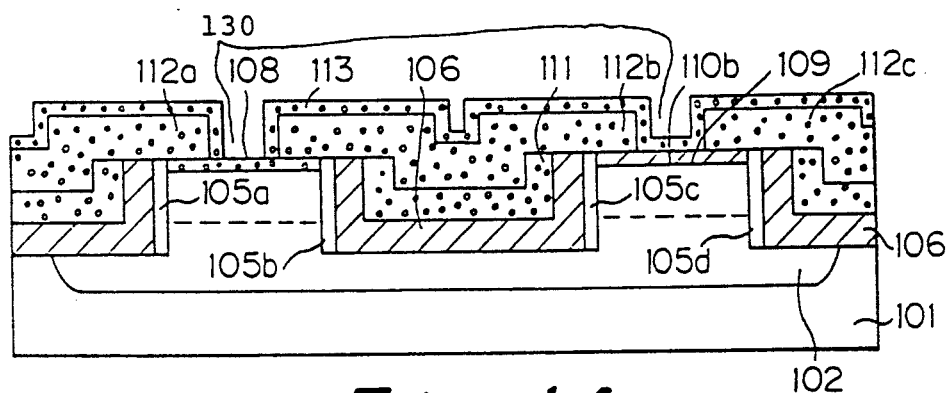

A CVD layer of polycrystalline silicon is then deposited on the entire surface of the structure shown in FIG. 12 to form a third polycrystalline silicon layer 113 which electrically connects the second polycrystalline silicon layers 112a, 112b and 112c with the mesa regions 103a and 103b, as shown in FIG. 13.

After hollow portions 130 which are located over the surfaces 108 and 109 of the mesa regions 103a and 103b are filled with a resist (not shown), boron ions are introduced into the third polycrystalline silicon layer 113 by ion implantation at a dosage of about $10^{15}$–$10^{16}$ cm$^{-2}$. The energy of the ion implantation is about 20–40 KeV.

Therefore, one part of the third polycrystalline silicon layer 113, which is located over the second polycrystalline silicon layers, as well as the second polycrystalline layer therebelow, is highly doped with boron ions and the other part of the third polycrystalline silicon layer 113, located in (along the sides and bottom of) the hollow portions 130, is not doped.

Figure 14:
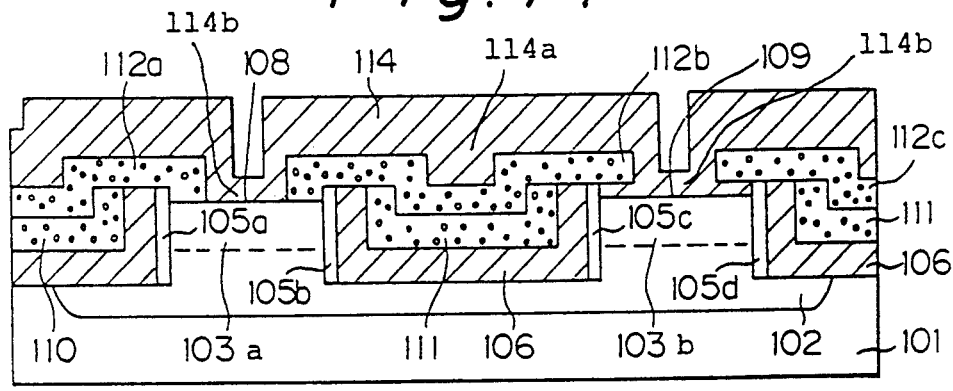

Then the resist in the hollow portions 130 is removed and the second polycrystalline silicon layers 112a, 112b and 112c and third polycrystalline silicon layer 113 are subjected to thermal oxidation at a temperature of about 800°-900° C. to form a silicon oxide film (the third insulation film) 114, as shown in FIG. 14. Since the speed of oxidation of the highly boron doped portions of the polycrystalline silicon layers is faster than that of the nondoped portion, the thickness of the portion of the silicon oxide film 114 located in the hollow portions 130 has one third of that located on the second polycrystalline silicon layers 112a, 112b and 112c.

Figure 15:
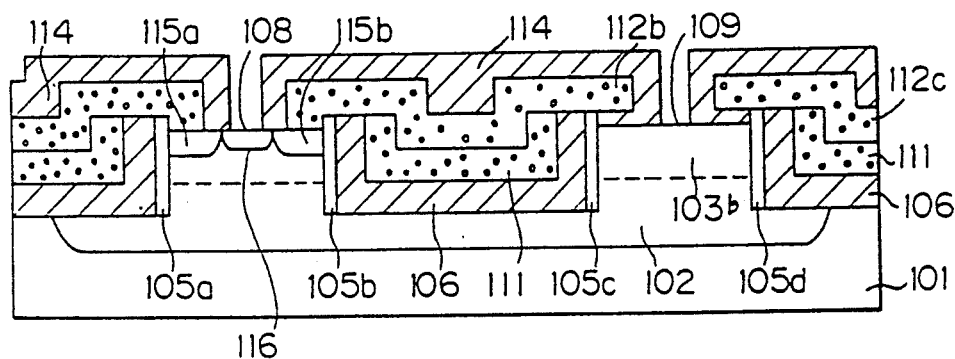

Then the silicon oxide film 114 is subjected to anisotropic etching until the surfaces 108 and 109 are exposed, as shown in FIG. 15. The portions 114a of the silicon oxide film 114 on the second polycrystalline silicon layers 112a, 112b and 112c remain (with a reduced thickness) because they are originally thicker than are the portions 114b on the surfaces 108 and 109 of the mesa regions 103a and 103b. The surface 108 of the mesa region 103a is oxidized to a thickness of about 50-100 Å to form a thin oxide layer (not shown). After that, boron ions are selectively introduced into the mesa region 103a by ion implantation, using a resist (not shown) as a mask, at a dosage of about $10^{13}$ cm$^{-2}$, thereby to form an inner base region 116 by self-alignment. The energy of the ion implantation is about 10-30 KeV. After the resist is removed, annealing is performed to cause a diffusion of boron from the second polycrystalline silicon layers 112a and 112b to the mesa region 103a so as to form outer base regions 115a and 115b by self-alignment and to connect the inner base region 116 and the outer base regions 115a and 115b.

Figure 16:
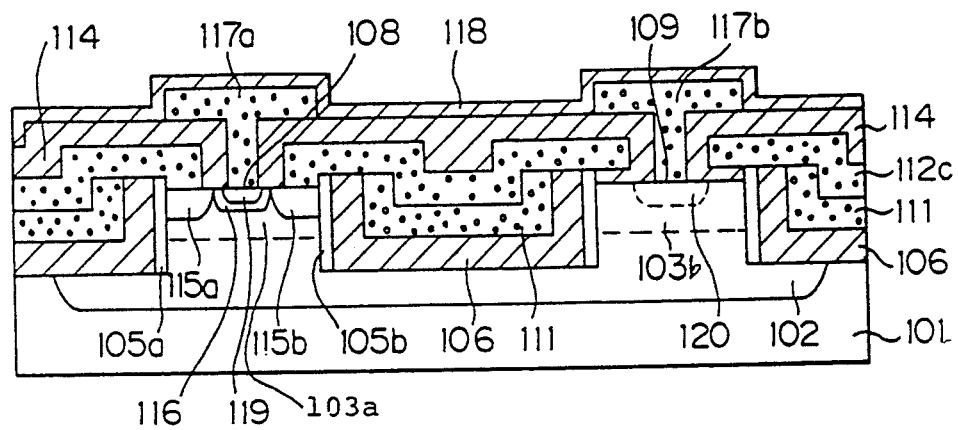

After the annealing, the thin oxide layer (not shown) located on the surface 108 is removed, and polycrystalline silicon is selectively deposited on the surfaces 108 and 109. Arsenic ions are introduced into the selectively deposited polycrystalline silicon at a dosage of about $10^{16}$ cm$^{-2}$ to form an emitter electrode 117a and a collector electrode 117b, as shown in FIG. 16. The energy of the ion implantation is about 40 KeV. Then, the emitter electrode 117a and the collector electrode 117b are covered by a silicon oxide layer 118 and annealing is performed. This annealing causes diffusion of arsenic ions from the emitter electrode 117a to the inner base region 116, so as to form an emitter region 119 by self-alignment, and diffusion from the collector electrode 117b to the mesa region 103b, so as to form a diffusion region 120 which reduces collector resistance.

Figure 17:
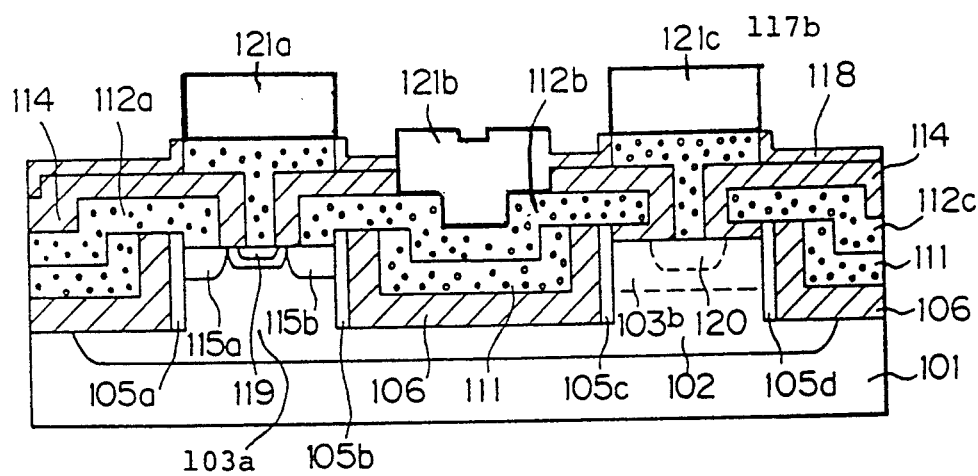

Referring to FIG. 17, contact holes are formed on the emitter electrode 117a, the collector electrode 117b and the second polycrystalline silicon layer 112b. Metal electrodes (contacts) 121a, 121b and 121c are formed in the contact holes to each connect to the emitter electrode 117a, the collector electrode 117b and the second polycrystalline silicon layer 112b (which forms the base electrode).

As has been described, according to the invention, the inner base region and the emitter region are obtained by self-alignment, so the area of the base region can be formed by the photolithographically as small as possible. Therefore, the emitter region, being smaller than the inner base region, will be smaller than can be formed photolithographically, and the area of the base-collector junction is reduced. This contrasts with the prior art method in which the emitter region is formed photolithographically so that the base and base-collector junction, necessarily being larger than the emitter region, cannot be made as small as the emitter region according to the method of the present invention. Furthermore, the base-collector parasitic capacitance is reduced and the operating speed of the transistor is substantially increased.

It will be understood that the above description of the present invention is susceptible to various modifications, changes and adaptations, and the same are intended to be comprehended within the meaning and range of equivalents of the appended claims.

What is claimed is:

1. A method of manufacturing a bipolar transistor, comprising the steps of:
   a. providing a semiconductor substrate having on a side thereof a semiconductor zone and first and second mesa regions formed on the semiconductor zone so as to define an isolation trench separating and surrounding the mesa regions, the semiconductor zone and the mesa regions being formed of a semiconductor material of a first conductivity type;
   b. forming a first insulation film on inner walls of the isolation trench;
   c. forming a second insulation film on upper surfaces of the mesa regions, the second insulation film having an inner region and an outer region, the outer region adjacent the first insulating layer;
   d. forming a first polycrystalline silicon layer on the first insulation film;
   e. selectively growing polycrystalline silicon from the first polycrystalline silicon layer onto the outer region of the second insulation film to form a second polycrystalline silicon layer while leaving the inner region of the second insulation film exposed;
   f. removing the second insulation film formed on the first mesa region to expose the upper surface of the first mesa region so as to leave a gap between the upper surface of the first mesa region and the second polycrystalline silicon layer;
   g. depositing polycrystalline silicon in the gap between the upper surface of the first mesa region and the second polycrystalline silicon layer so as to connect the second polycrystalline silicon layer to the upper surface of the first mesa region;
   h. forming a third insulating film covering upper and side surfaces of the second polycrystalline silicon layer;
   i. forming a base and an emitter in the first mesa region, the emitter being formed at a portion of the upper surface of the first mesa region remaining exposed after said step g; and
   j. providing a base electrode, an emitter electrode and a collector electrode electrically connected to the base, the emitter and the upper surface of the second mesa region, respectively.

2. A method of manufacturing a bipolar transistor according to claim 1, further comprising the step of doping the first polycrystalline silicon layer with a dopant of a second conductivity type.

3. A method of manufacturing a bipolar transistor according to claim 2, further comprises the step of diffusing the dopant from the first polycrystalline silicon layer into the second polycrystalline silicon layer.

4. A method of manufacturing a bipolar transistor according to claim 1, wherein the semiconductor material is formed on the substrate epitaxially.

5. A method of manufacturing a bipolar transistor, comprising the steps of:
   a. providing a semiconductor substrate having on a side thereof a semiconductor zone and first and second mesa regions formed on the semiconductor zone so as to define an isolation trench separating and surrounding the mesa regions, the semiconductor zone and the mesa regions being formed of a semiconductor material of a first conductivity type;
   b. forming a first insulation film on inner walls of the isolation trench;
   c. forming a second insulation film on upper surfaces of the mesa regions, the second insulation film having an inner region and an outer region, the outer region adjacent the first insulating layer;
   d. forming a first polycrystalline silicon layer on the first insulation film
   e. selectively growing polycrystalline silicon from the first polycrystalline silicon layer onto the outer region of the second insulation film to form a second polycrystalline silicon layer while leaving the inner region of the second insulation film exposed;
   f. removing the second insulation film formed on the first mesa region to expose the upper surface of the first mesa region while retaining the second insulation film formed on the upper surface of the second mesa region;
   g. depositing polycrystalline silicon on the exposed upper surface of the first mesa region, the second polycrystalline silicon layer and the exposed inner region of the second insulation film formed on the surface of the second mesa region, to form a third polycrystalline silicon layer;
   h. introducing an impurity into a part of the third polycrystalline silicon layer located over the second polycrystalline silicon layer so as to increase a speed of oxidation thereof;
   i. subjecting the structure obtained by steps a through h to an oxidizing heat treatment so that the second polycrystalline silicon layer and the part of the third polycrystalline silicon layer located over the second polycrystalline silicon layer are oxidized more completely than parts of the third polycrystalline silicon layer located over the upper surface of the first mesa region and the exposed portion of the second insulation film on the upper surface of the second mesa region, the oxidized portions of the second an third polycrystalline silicon layers forming a third insulation film;
   j. subjecting the third insulation film to anisotropic etching until a portion of the upper surface of each of the first and second mesa regions is exposed;
   k. after said step of subjecting the third polycrystalline silicon layer to anisotropic etching, forming a base and an emitter in the first mesa region with the emitter at the exposed portion of the upper surface of the first mesa region; and
   l. providing a base electrode, an emitter electrode and a collector electrode electrically connected to the base, the emitter and the upper surface of the second mesa region, respectively.

6. A method of manufacturing a bipolar transistor according to claim 5, further comprises the step of doping the first polycrystalline silicon layer with a dopant of the second conductivity type.

7. A method of manufacturing a bipolar transistor according to claim 6, further comprises the step of diffusing the dopant from the first polycrystalline silicon layer into the second polycrystalline silicon layer.

8. A method of manufacturing a bipolar transistor according to claim 5, wherein the semiconductor material is formed on the substrate epitaxially.

9. A method of manufacturing a bipolar transistor according to claim 5, further comprising the step of forming a fourth insulating film on side surfaces of the mesa regions prior to said step b.

10. A method of manufacturing a bipolar transistor, comprising the steps of:
    a. forming a first device forming region, a second device forming region and a semiconductor zone on a semiconductor substrate, all of a first conductivity type, the semiconductor zone connecting the first and second regions, at least the first region being formed photolithographically, the first region having an upper surface, the upper surface having an inner surface region and an outer surface region surrounding the inner surface region;
    b. forming a first polycrystalline silicon layer around the first region;
    c. providing an insulating material between said first and second regions and said first polycrystalline silicon layer so as to electrically insulate the first and second regions from the first polycrystalline silicon layer;
    d. after said steps b and c, forming a second polycrystalline silicon layer extending from the first polycrystalline silicon layer onto said outer surface region, while leaving said inner surface region exposed, said step of forming a second polycrystalline silicon layer including the step of selectively growing polycrystalline silicon from the first polycrystalline silicon layer over said outer surface portion after said steps b and c;
    e. forming a base and an emitter in the first region with the emitter at said inner surface region; and
    f. a base electrode, an emitter electrode and a collector electrode electrically connected to the base, the emitter and an upper surface of the second region, respectively.

11. A method of manufacturing a bipolar transistor according to claim 10, further comprising the step of forming an insulating layer on an exposed upper surface of the second polycrystalline silicon layer after said step d, said step f including the step of electrically connecting the collector electrode to the second polycrystalline silicon layer.

12. A method of manufacturing a bipolar transistor according to claim 10, further comprising the step of introducing impurities into the second polycrystalline silicon layer, said step e including the step of diffusing the impurities from the second polycrystalline silicon layer into the first region to form an outer portion of the base.

13. A method of manufacturing a bipolar transistor according to claim 1, wherein said step i includes the steps of
    i1. doping a first portion of the first mesa region with a dopant of a second conductivity type through the portion of the upper surface of the first mesa region remaining exposed after said step g, to form an inner portion of the base and i2. doping a second portion of the first mesa region in the first portion of the first mesa region with a dopant of the first conductivity type through the portion of the upper surface of the first mesa region remaining exposed after said step g, to form the emitter in the base.

14. A method of manufacturing a bipolar transistor according to claim 13, further comprising the step of doping the second polycrystalline layer with the dopant of the second conductivity type and said step i further comprises the step of diffusing the dopant of the second conductivity type from the second polycrystalline layer into a third portion of the first mesa region adjacent to the first portion of the first mesa region, so as to form an outer portion of the base joining the inner portion of the base to the second polycrystalline layer, whereby the base is connected to the second polycrystalline layer, the doped second polycrystalline layer forming the base electrode.

15. A method of manufacturing a bipolar transistor according to claim 13, wherein said step j is performed after said step i1 and includes the steps of depositing a quantity of polycrystalline silicon on the portion of the upper surface of the first mesa region remaining exposed after said step g and then doping the quantity of polycrystalline silicon with dopant of the first conductivity type to form the emitter electrode, said step i2 comprising the step of diffusing the dopant of the first conductivity type from the emitter electrode into the second portion of the first mesa region.

16. A method of manufacturing a bipolar transistor according to claim 1, further comprising the step of connecting first, second and third metal contacts respectively to the base electrode, the emitter electrode and the collector electrode.

17. A method of manufacturing a bipolar transistor according to claim 1, wherein the emitter is formed in said step i by diffusing a dopant of the first conductivity type into the first mesa region.

18. A method of manufacturing a bipolar transistor according to claim 5, wherein said step k includes the steps of
    (1) doping a first portion of the first mesa region with a dopant of a second conductivity type through the portion of the upper surface of the first mesa region exposed after said step j, to form an inner portion of the base, and
    (2) doping a second portion of the first mesa region in the first portion of the first mesa region with a dopant of the first conductivity type through the portion of the upper surface of the first mesa region exposed after said step j, to form the emitter in the base.

19. A method of manufacturing a bipolar transistor according to claim 10, wherein said step e includes the steps of
    (1) doping a first portion of the first device forming region with a dopant of a second conductivity type through the portion of the upper surface of the first mesa region remaining exposed after said step d, to form an inner portion of the base, and
    (2) doping a second portion of the first device forming region in the first portion of the first device forming region with a dopant of the first conductivity type through the portion of the upper surface of the first device forming region exposed after said step d, to form the emitter in the base.

20. In a method of manufacturing a bipolar transistor on a semiconductor substrate, the transistor having a base, an emitter and a collector, the improvement including the steps of:
    a. providing a semiconductor substrate having a semiconductor zone and a mesa region on a surface of the semiconductor zone, the mesa region and the semiconductor zone being formed of a semiconductor material of a first conductivity type, an isolation trench surrounding the mesa region,
    b. forming a first insulation film on inner walls of the isolation trench;
    c. forming a second insulation film on an upper surface of the mesa region, the second insulation film having an inner region and an outer region, the outer region adjacent the first insulating layer;
    d. forming a first polycrystalline silicon layer on the first insulation film;
    e. selectively growing polycrystalline silicon from the first polycrystalline silicon layer onto the outer region of the second insulation film to form a second polycrystalline silicon layer while leaving the inner region of the second insulation film exposed;
    f. removing the second insulation to expose the upper surface of the mesa region;
    g. depositing polycrystalline silicon on the exposed upper surface of the mesa region and on the second polycrystalline silicon layer, to form a third polycrystalline silicon layer;
    h. introducing an impurity in a part of the third polycrystalline silicon layer located over the second polycrystalline silicon layer so as to increase a speed of oxidation thereof;
    i. subjecting the structure obtained by said steps a through h to an oxidizing heat treatment so that the second polycrystalline silicon layer and the part of the third polycrystalline silicon layer located over the second polycrystalline silicon later are oxidized more completely than parts of the third polycrystalline silicon layer located over the upper surface of the mesa region, the oxidized portions of the second and third polycrystalline silicon layers forming a third insulation film;
    j. subjecting the third insulation film to anisotropic etching until a portion of the upper surface of the mesa region is exposed;
    k. after said step j, forming a base in the mesa region, including diffusing a dopant of a first conductivity type from into a first base portion of the mesa region at the exposed portion of the upper surface of the mesa region; and
    l. after said step k, diffusing a dopant of the first conductivity type into a center part of the first base portion to form the emitter.

21. A method of manufacturing a bipolar transistor according to claim 20, further comprising the step of doping the second polycrystalline layer with the dopant of the second conductivity type and said step k further comprises the step of diffusing the dopant of the second conductivity type from the second polycrystalline layer into an outer base portion of the mesa region connected to the inner base portion.

* * * * *